(12) United States Patent
Alderton

(10) Patent No.: US 8,818,319 B2
(45) Date of Patent: Aug. 26, 2014

(54) SIGNAL DISTRIBUTION AND FILTERING IN LOW NOISE BLOCK DOWNCONVERTERS

(75) Inventor: Martin Christopher Alderton, San Diego, CA (US)

(73) Assignee: Entropic Communications, Inc., San Diego, CA (US)

( * ) Notice: Subject to any disclaimer, the term of this patent is extended or adjusted under 35 U.S.C. 154(b) by 0 days.

(21) Appl. No.: 13/537,727

(22) Filed: Jun. 29, 2012

(65) Prior Publication Data

US 2013/0293322 A1    Nov. 7, 2013

Related U.S. Application Data

(60) Provisional application No. 61/642,361, filed on May 3, 2012.

(51) Int. Cl.
*H04B 1/28* (2006.01)

(52) U.S. Cl.
USPC ............ 455/333; 455/347; 361/753; 333/208

(58) Field of Classification Search
USPC ........ 455/90.3, 313, 323, 333, 337–341, 347, 455/550.1; 361/753; 333/208
See application file for complete search history.

(56) References Cited

U.S. PATENT DOCUMENTS

| 2010/0045590 A1* | 2/2010 | Kumamoto et al. .......... 345/102 |
| 2011/0068990 A1* | 3/2011 | Grzyb et al. ................. 343/772 |
| 2012/0268329 A1 | 10/2012 | Laidig et al. |

* cited by examiner

*Primary Examiner* — Nhan Le
(74) *Attorney, Agent, or Firm* — Richard Bachand; Bruce Greenhaus; Sheppard Mullin Richter & Hampton LLP

(57) ABSTRACT

Various embodiments implement waveguides for signal distribution or signal filtering in satellite receivers. According to some embodiments, a low noise block downconverter (LNB) is implemented using waveguides configured for signal distribution, band pass filtering, low pass filtering, high pass filtering, or band stop filtering. For some embodiments, the waveguides may be formed by the LNB chassis and the ground plane of a printed circuit board mounted to the LNB chassis.

19 Claims, 8 Drawing Sheets

SIGNAL DISTRIBUTION AND FILTERING IN LOW NOISE BLOCK DOWNCONVERTERS

CROSS-REFERENCE TO RELATED APPLICATIONS

This application claims the benefit of U.S. Provisional Application No. 61/642,361 filed May 3, 2012, which is hereby incorporated herein by reference in its entirety.

TECHNICAL FIELD

The invention(s) described herein relate generally to low-noise block downconverters (LNB), and more particularly, some embodiments relate to signal distribution or signal filtering in LNBs.

DESCRIPTION OF THE RELATED ART

A low-noise block downconverter (LNB) is the receiving device of a parabolic satellite dish—for example, for satellite TV reception. The LNB is usually fixed on the satellite dish at the focus of the reflector. Satellite receivers in home entertainment systems are typically required to receive RF signals in various microwave frequency bands. For example, the frequency spectra of 12.2-12.7 GHz in the Ku band, 18.3-18.8 GHz in the lower Ka band ("Ka-Lo band"), and 19.7-20.2 GHz in the upper Ka band ("Ka-Hi band") have been used in satellite downlinks for home entertainment. As a result, the LNB typically includes multiple downconverter chains in a common housing.

A conventional satellite receiver may include a plurality of radio frequency-to-intermediate frequency (RF-to-IF) downconverters for a plurality of (radio frequency (RE) bands, respectively. FIG. 1 is a diagram illustrating an example of a conventional satellite receiver capable of receiving satellite downlink signals in the Ku, Ka-Lo and Ka-Hi bands. Referring to FIG. 1, the apparatus for converting RF signals to IF signals in the conventional satellite receiver receives RF signals from three separate antenna feeds, including an antenna feed 102 for the Ku band, a first antenna feed 104 for the Ka-Lo and Ka-Hi bands, and a second antenna feed 106 for the Ka-Lo and Ka-Hi bands. In atypical implementation, the antenna feeds 102, 104 and 106 are separated by predetermined angles for receiving separate satellite downlink signals. Moreover, each of the antenna feeds may receive RF signals occupying the same frequency band but separated by polarization. For example, the first Ka-Lo/Ka-Hi antenna feed 104 at 102.8° has two separate polarized channels—left-hand circular polarized (LHCP) channel 108 and a right-hand circular polarized (RHCP) channel 110. Similarly, the second Ka-Lo/Ka-Hi antenna feed 106 at 99.2° angle has LHCP and RHCP channels 112 and 114, respectively, and the Ku-band antenna feed at 101° angle has LHCP and RHCP channels 116 and 118, respectively. Alternatively, vertical and horizontal polarizations may be used instead of left and right circular polarizations to separate the received input RF signals from the same feed.

The RF signal in each of the polarization channels from each of the antenna feeds passes through a separate downconverter chain that includes an oscillator, a mixer and one or more filters. For example, the downconverter chain 120 for the RHCP channel from the 102.8° Ka-Lo/Ka-Hi feed 104 includes one or more RF amplifiers 122 and 124 and an RF filter 126. The first amplifier 122 in the downconverter chain may be a pre-amplifier, for example. For the RHCP channel from the 102.8° Ka-Lo/Ka-Hi feed 104, the received RF signal passes through one or more filters. For example, as shown, the received RF signal passes through two parallel band pass filters 128 and 130 for Ka-Lo and Ka-Hi bands, respectively. In other implementations, the Ka-Lo and Ka-Hi signals may share a band pass filter. The Ka-Lo RF signal is mixed with a local oscillator signal from an oscillator 132 by a mixer 134 to generate an IF signal (e.g., in a frequency range of 260-760 MHz), and an image of the IF signal. A band pass filter 136 filters out the image such that only the desired IF signal is provided at the IF output 138. In the example shown in FIG. 1, the local oscillator frequency of the oscillator 132 for the Ka-Lo band is 18.04 GHz.

Similarly, the Ka-Hi RHCP RF signal from the 102.8° feed 104 that has passed through the band pass filter 130 is mixed with a local oscillator signal from a separate local oscillator 140 by a mixer 142 to generate an IF signal, also in the 260-760 MHz band, for example, and an image of that IF signal. A band pass filter 144 filters out the image such that only the desired IF signal is provided at the IF output 146.

The structure for each downconverter chain for converting received RF signals from the 99.2° Ka-band feed 106 is identical to that of the 102.8° Ka-band feed 104. Again, the 99.2° Ka-band feed has two separate local oscillators 146 and 148 for Ka-Lo and Ka-Hi bands, respectively. The Ku-band downconverter chain for the 101° Ku-band feed is also similar to the Ka-band downconverter chains, except that the RHCP and LHCP channels are not further divided into high and low frequency sub-bands. In the Ku-band downconverter chain, a separate local oscillator 150 with an oscillation frequency of 11.95 GHz is provided for downconverting the Ku-band RF signals to respective IF signals in the RHCP and LHCP channels.

In typical LNBs the high-frequency components share a printed circuit board (PCB) housed in a cavity of the LNB chassis. Generally, filtering is performed on the PCB using microstrip structures. In some cases, these structures require tuning, which can add to the manufacturing cost. Additionally, the structures are known to add loss, which can degrade performance of LNBs. Signal distribution is typically performed using microstrip traces. The traces are generally known to be lossy and to suffer from isolation problems because of coupling between the traces, which further degrades performance.

SUMMARY OF VARIOUS EMBODIMENTS

Various embodiments directed toward apparatuses, such as satellite receivers, that comprise a conductive waveguide (hereafter, simply referred to as "waveguide") formed by a chassis (e.g., satellite receiver chassis) and a printed circuit board mounted to the chassis (e.g., mounted within a cavity of the satellite receiver chassis). Some embodiments provide for low-noise block downconverters (LNBs), which can be utilized in satellite receivers.

An apparatus, in accordance with some embodiments, may comprise a chassis, a printed circuit board comprising a ground plane and a device layer, and a waveguide having at least one side formed by a groove (or trough) in the chassis and at least one side formed by the ground plane of the printed circuit board (PCB). In some embodiments, the waveguide formed by the groove and the ground plane of the PCB has dimensions suitable for propagating electromagnetic radiation in TE01 mode. The apparatus may further comprise a means of coupling signals between the printed circuit board and the waveguide. Additionally, the apparatus may further comprise a first device and a second device disposed on the device layer of the printed circuit board, such that the waveguide formed by the groove in the chassis and the ground plane of the printed circuit board connects the first and second devices. For some embodiments, the groove forms at least three sides of the waveguide while the ground plane of the printed circuit board forms a fourth side.

Depending on the embodiment, the waveguide formed by the chassis and the ground plane of the printed circuit board may be configured to implement a filter (e.g., a band pass filter, a low pass filter, a high pass filter, or a band stop filter) or to perform signal distribution. For some embodiments, where the waveguide implements a filter, the apparatus may further comprise a printed filter disposed on the device layer and coupled between the waveguide and the first device or between the waveguide and the second device such that the printed filter and the waveguide implement a composite filter. Additionally, for some embodiments, the chassis forming the waveguide may include a cavity that houses the printed circuit board. The printed circuit board may be disposed over the groove of the chassis such that the ground plane of the printed circuit board may be in direct contact with the chassis, or may be capacitively coupled with the chassis. According to some embodiments, the printed circuit board may be configured to implement functions relating to a low noise block downconverter (LNB). In some embodiments, the first device disposed on the printed circuit board may be an amplifier, an antenna feed, or a mixer.

Various embodiments may provide for methods comprising: receiving a first signal at a first device disposed on a device layer of a printed circuit board, wherein the printed circuit board comprises a ground plane and the device layer; and transmitting a second signal, from the first device to a second device disposed on the device layer of the printed circuit board, using a waveguide having at least one side formed by a groove in a chassis housing the printed circuit board and at least one side formed by the ground plane of the printed circuit board. The methods may further comprise receiving the second signal at the second device disposed on the device layer of the printed circuit board.

This summary does not limit the scope of the invention(s), which is defined solely by the claims and the equivalents thereof. Other features and aspects will become apparent from the following detailed description, taken in conjunction with the accompanying drawings.

BRIEF DESCRIPTION OF THE DRAWINGS

Various embodiments of the invention(s) are described in detail with reference to the following figures. The drawings are provided for purposes of illustration only and merely depict typical or example embodiments of the invention(s). These drawings are provided to facilitate the reader's understanding of the invention(s) and shall not be considered limiting of the breadth, scope, or applicability of the invention(s). It should be noted that for clarity and ease of illustration these drawings are not necessarily made to scale.

Some of the figures included herein illustrate various embodiments from different viewing angles. Although the accompanying descriptive text may refer to spatial orientation of elements of the figures, such references are merely descriptive and do not imply or enquire implementation or use in a particular spatial orientation.

The figures are not intended to be exhaustive or to limit the invention(s) to the precise form disclosed. It should be understood that the invention(s) described herein can be practiced with modification and alteration, and that the invention(s) be limited only by the claims and the equivalents thereof.

DETAILED DESCRIPTION OF THE
EMBODIMENTS OF THE INVENTION(S)

Apparatuses and methods for signal distribution and filtering in satellite receivers, such as in low-noise downconverters (LNBs), are presented. Various embodiments utilize a chassis, housing circuitry of high frequency electronic components, to provide waveguides for signal distribution and filtering functions. Particular embodiments are suitable for implementations in LNBs for down conversion of signals sent at or above 12 GHz, and in particular signals sent at 20 GHz, such as Ku band and Ka band signals.

Figure 1:
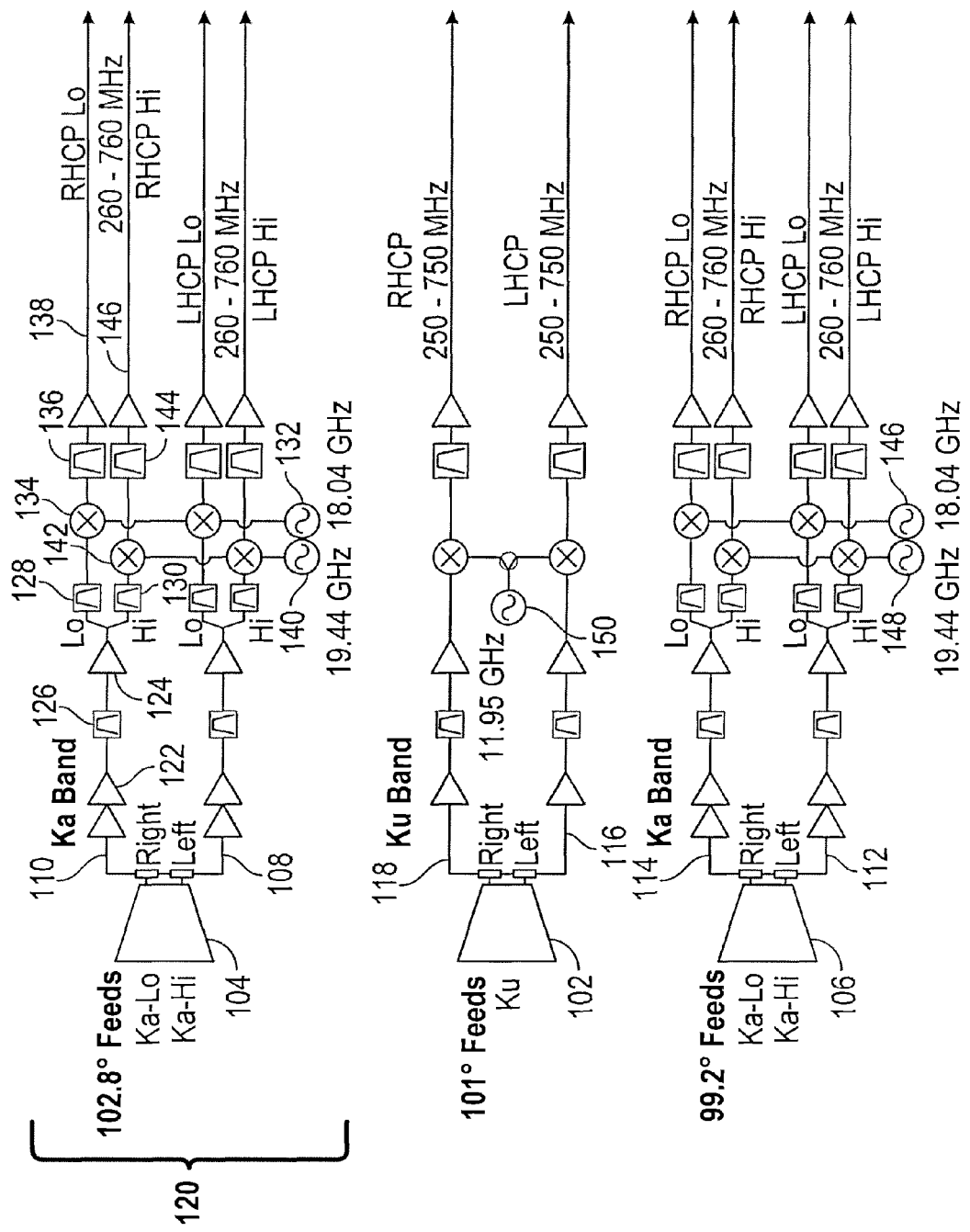
FIG. 1 is a diagram illustrating an example of a conventional satellite receiver capable of receiving satellite downlink signals in the K-band.
Figure 2:
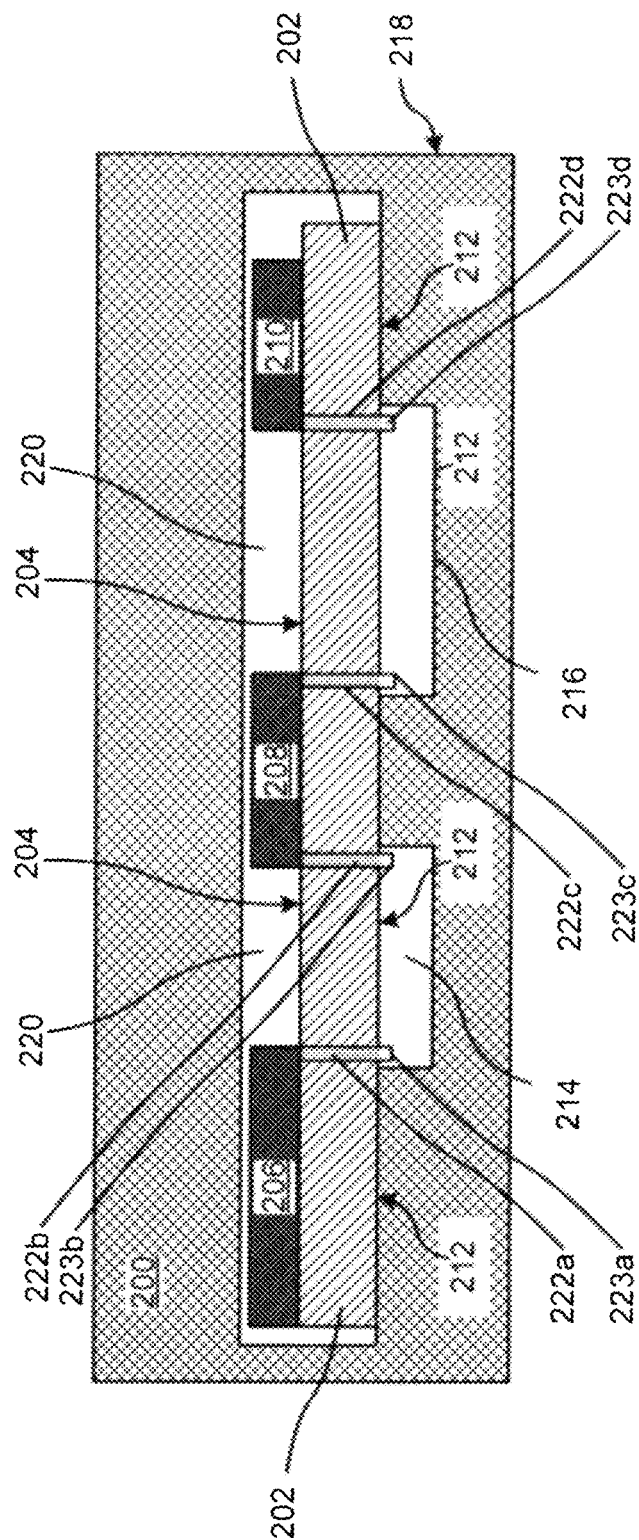
FIG. 2 is a diagram illustrating exemplary waveguides formed by a chassis and a printed circuit board housed in the chassis in accordance with some embodiments.

FIG. 2 is a diagram illustrating exemplary waveguides formed by a chassis and a printed circuit board (PCB) housed in the chassis in accordance with some embodiments. In the illustrated embodiment, an LNB includes a chassis or housing 200. The chassis 200 houses a printed circuit board (PCB) 202 having a first side 204 with attached electronic devices 206, 208, and 210, such as amplifiers, mixers and antenna feeds. The printed circuit board 202 also has a ground plane 212, disposed on a side of the PCB 202 that is opposite the first side 204 of the PCB 202. The ground plane 212 may be a conventional PCB ground plane 212. Such a ground plane 212 generally comprises a region of conductive material, such as copper, that provides a common plane for grounding devices on side 204. For example, the ground plane 212 may comprise a region of conductive foil or a conductive layer disposed on the underside of the PCB 202. In particular cases, the ground plane 212 has a conductivity of at least $10^6$ S/m. As is known in the art, the ground plane 212 may not be a continuous surface, for example, the ground plane 212 may have perforations, apertures, or other discontinuities.

The PCB 202 is mounted to the chassis 200 such that the ground plane 212 (of the PCB 202) is electrically coupled to the chassis 200. The chassis 200 may provide signal distribution and filtering functions by implementing waveguides, formed by grooves 214 and 216 in the chassis 200 and the ground plane 212 of the PCB 202 (hereafter, referred to as waveguides 214 and 216). By mounting the PCB 202 to the chassis 200 in this manner, the ground plane 212 forms a fourth side of the waveguides 214 and 216.

In some embodiments, the ground plane 212 is in direct contact with the chassis 200, along the entire length of each of the waveguides 214 and 216. In some cases, the chassis 200 and the ground plane 212 are not in complete contact along the interface defining the waveguides 214, 216. In these cases, the PCB is mounted to the chassis 200 such that any gaps between the ground plane 212 and the chassis 200 do not adversely affect the operation of the waveguides 214 and 216. For example, the ground plane 212 may be maintained in sufficient proximity to the chassis 200 that, due to capacitive coupling, any gaps act as electrical shorts at or the transmission frequencies of waveguides 214 or 216.

As described above, the ground plane 212 may have discontinuities such as apertures or perforations. In embodiments employing such ground planes, discontinuities proximal to waveguides 214 or 216 are electrically small enough to prevent significant energy loss or result in emitting unwanted electromagnetic radiation to surrounding circuitry.

Depending on the embodiment, the PCB 202 may be mounted to the chassis 202 by way of bonding, fasteners (e.g., screws), or some other suitable method of mounting. Additionally, the PCB 202 may be fully or partially contained within a cavity 220 of the chassis 200. In some embodiments, the PCB 202 may be mounted to proximally to a side 218 of the chassis 200 to facilitate the electrical coupling between the PCB 202 and the chassis 200.

As noted herein, the waveguides 214 and 216 may perform signal distribution functions. For some embodiments, the waveguides 214 or the waveguide 216 may have dimensions suitable for propagating electromagnetic radiation in TE01 mode. Generally, the determination of acceptable waveguide dimensions (or a range of acceptable waveguide dimensions) required for a given signal frequency is well known by those skilled in the art.

As illustrated in FIG. 2, the waveguide 214 permits transmission of signals between the device 206 and the device 208, while the waveguide 216 permits transmission of signal between the device 208 and the device 210. As also illustrated in FIG. 2, vias 222a and 222b in the PCB 202 facilitate coupling between the device 206, the waveguide 214, and the device 208, while vias 222c and 222d in the PCB 204 facilitate coupling between the device 208, the waveguide 216, and the device 210. The vias 222a, 222b, 222c, and 222d terminate in posts 223a, 223b, 223c, and 223d, respectively. The posts 223a, 223b, 223c, and 223d extend into the waveguides 214, 216 for a sufficient distance to provide adequate coupling to the waveguide. For some embodiments, a specifically designed probe may be disposed (e.g., printed) on the PCB 202 in place of, or in addition to, the vias 222a-d to couple signals between the devices 204, 206 and 208 and the waveguides 214 and 216. Such probes may also extend into the waveguides 214 and 216 or be coupled to posts 223a-d.

In some embodiments, the waveguides 214 and 216 may be used to perform filtering functions. For example, using the inherent ability of waveguides to act as high pass filters (i.e., signals below the waveguide's cutoff frequency do not propagate), the waveguide 214 or the waveguide 216 may be formed such that frequencies are filtered. Additionally, well known methods of implementing low pass or band pass filtering functions in waveguides may be utilized to implement desired filter characteristics in the waveguide 214 or the waveguide 216. For example, one or more inductive irises or posts could be provided within the waveguide 214 or 216 to provide band pass filtering. As the filter properties of the waveguides 214 and 216 may be determined by their manufacture (e.g., construction of the chassis 200 and its grooves), individual tuning may not be necessary to achieve desired filtering performance from the waveguides 214 and 216. In further embodiments, tuning elements could be provided to allow tuning the waveguide 214 or 216.

As an example, the device 206 may comprise an antenna feed, the device 208 may comprise a first amplifier, and the device 210 may comprise a second amplifier. According to this example, the waveguide 214 could enable the antenna feed (i.e., the device 206) to transmit signals to the preamplifier (i.e., the device 208) without filtering (other than natural high pass filtering inherent to the waveguide 214). Continuing with the example, the waveguide 209 could be implemented to function as a band pass filter of desired filtering parameters and to transmit signals from the preamplifier (i.e., the device 208) to the amplifier (i.e., the device 210). An exemplary circuit comprising the foregoing configuration may be utilized, for example, in a low-noise downconverter (LNB) to provide an amplified and filtered satellite signal for downconversion.

Figure 3:
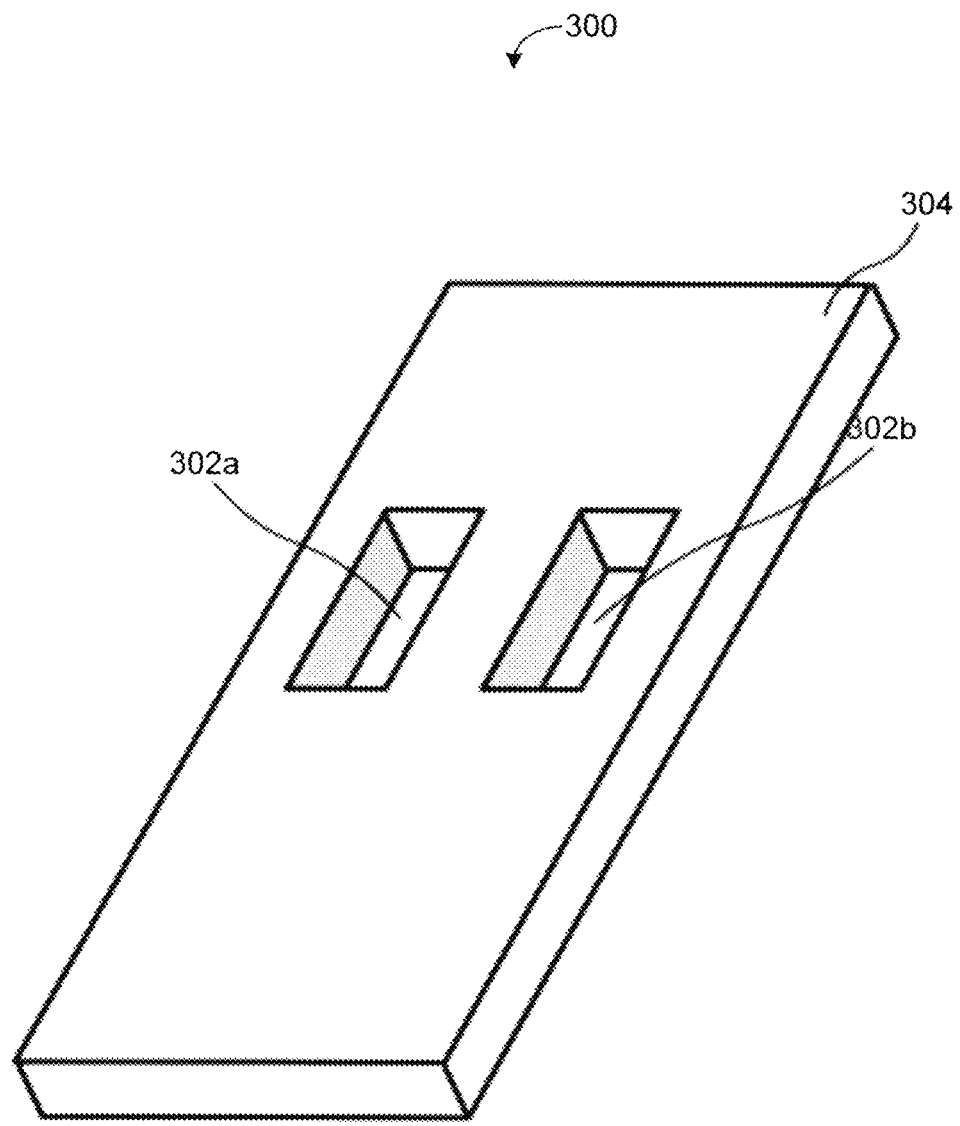
FIGS. 3-6 are diagrams illustrating exemplary assemblies utilized in forming a waveguide in accordance with some embodiments.

FIGS. 3-6 are diagrams illustrating exemplary assemblies utilized in forming a waveguide in accordance with some embodiments. In particular, FIG. 3 illustrates an exemplary chassis 300 that may be utilized in some embodiments. As shown, the chassis 300 comprises grooves 302a and 302b formed in a base plane 304 of the chassis 300. In accordance with various embodiments discussed herein, each of the grooves 302a and 302b may be utilized in conjunction with the ground plane of a printed circuit board (PCB) to form an individual waveguide. As noted herein, each waveguide formed may be utilized for signal distribution and further utilized to perform signal filtering. For certain embodiments, each waveguide can be used in conjunction with a printed filter to function as a composite filter. For instance, where the waveguide formed may be configured to function as a high pass filter while a printed low pass filter on the PCB, thereby forming a composite band pass filter.

Figure 4:
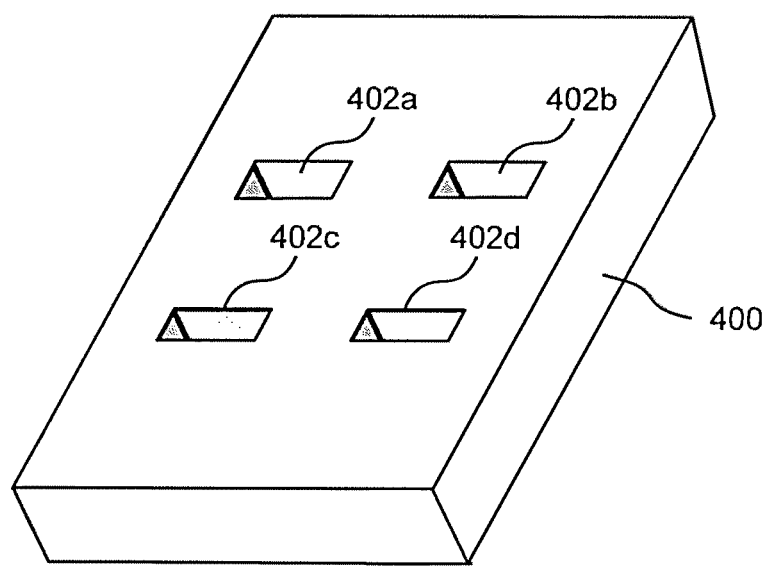

FIG. 4 presents an exemplary PCB 400 that could be utilized with the groove 310a or the groove 310b of FIG. 3 to form a waveguide in accordance with some embodiments. As depicted, the PCB 400 comprises vias 402a, 402b, 402c, and 402d configured to allow signal propagation from one or more devices mounted on a top surface of the PCB 400 to one or more waveguides formed by a ground plane of the PCB 400.

Figure 5:
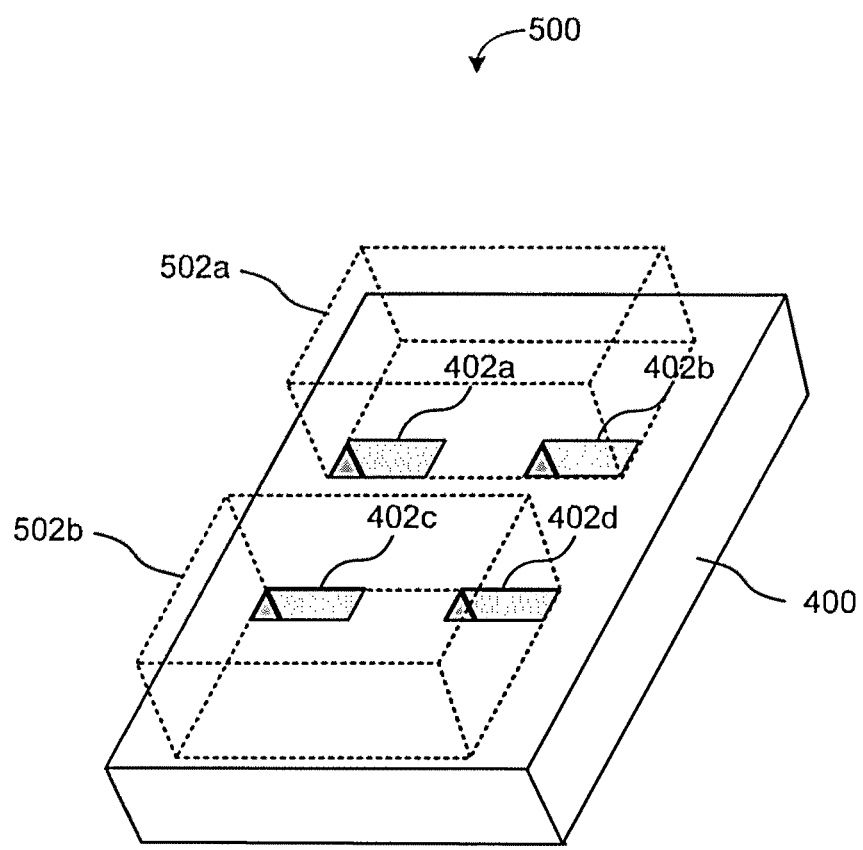

FIG. 5 illustrates an exemplary assembly 500 comprising the PCB 400 of FIG. 4, a device 502a, and a device 502b, in accordance with some embodiments. As shown, the devices 502a and devices 502b are mounted on the PCB 400 such that at least a portion of the device 502a is positioned over the vias 402a and 402b of the PCB 400 and at least a portion of the device 502b is positioned over the vias 402c and 402d of the PCB 400. Positioning the devices 502a-b over the vias 402a-d in this manner may enable the devices 502a-b to electrically couple to the vias 402a-d, and permit the devices 502a-b to transmit and receive signals through the vias 402a-d. For example, signals propagating through the vias 402a-d may be between one of the devices 502a-b and a waveguide located under the PCB 400 (e.g., a waveguide formed by the ground plane of the PCB 400 and a groove in a chassis to which the PCB 400 is mounted). As noted herein, the devices 502a and 502b may relate to devices that operate on signals including, for example, amplifiers, mixers, and antenna feeds.

Figure 6:
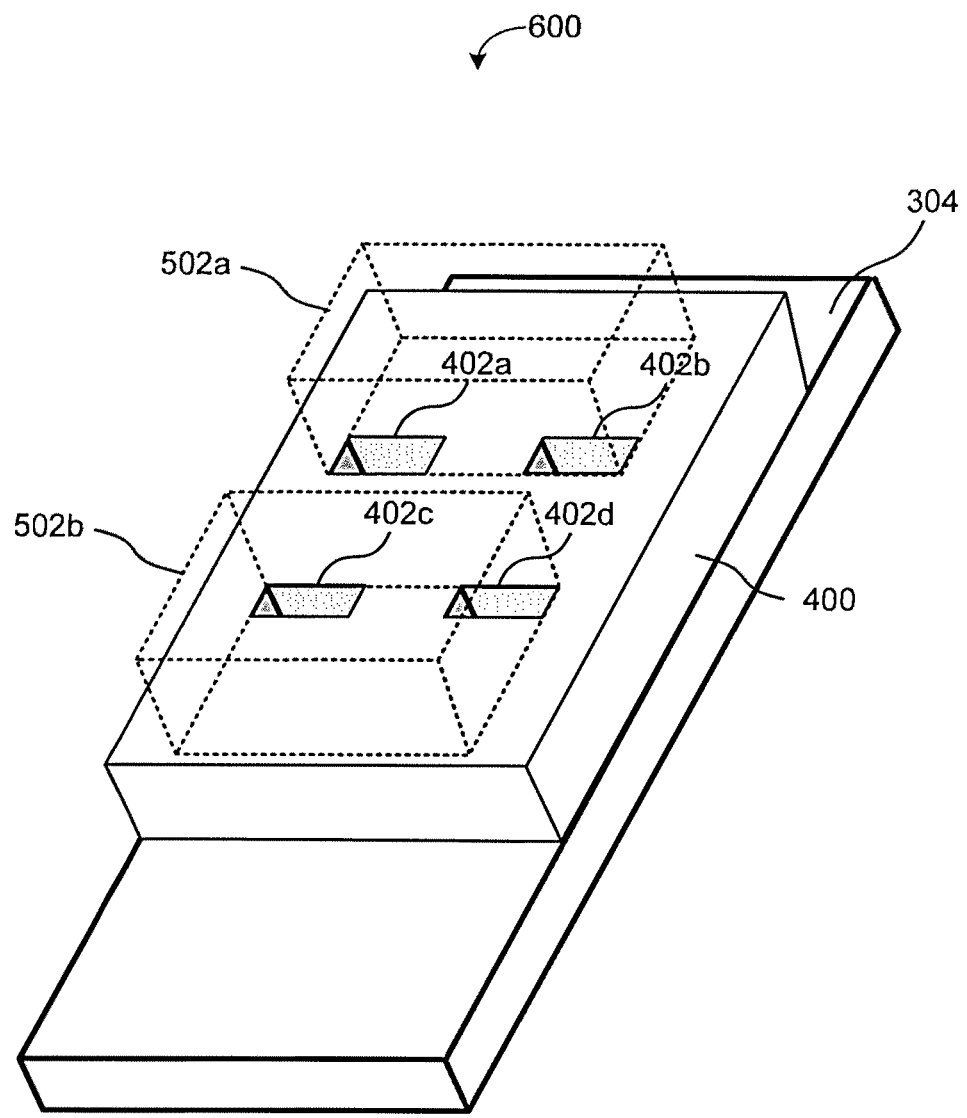

FIG. 6 illustrates an exemplary assembly 600 comprising the chassis 300 of FIG. 3 and the assembly 500 of FIG. 5, in accordance with some embodiments. In particular, FIG. 6 illustrates how, according to some embodiments, the PCB 400, and the devices 502a and 502b mounted thereon, can be mounted on and coupled to the base plane 304 of the chassis 300. In some embodiments, the PCB 400 may be mounted over the base plane 304 such that the ground plane of the PCB 400 is in direct contact with the base plane 304 along the entire length of the grooves 302a and 302b of the chassis 300. Additionally, the PCB 400 may be position over the base plane 304 of the chassis 300 such that the vias 402a-d of the PCB 400 substantially align with the length-wise ends of the grooves 302a and 302b. As noted herein, the ground plane of the PCB 400 may be mounted to the chassis 300 such that gaps exist between the ground plane and the chassis 300, without impacting the functionality of the waveguides formed by the PCB 400 and the groove 302a and 302b (due to capacitive coupling).

Figure 7:
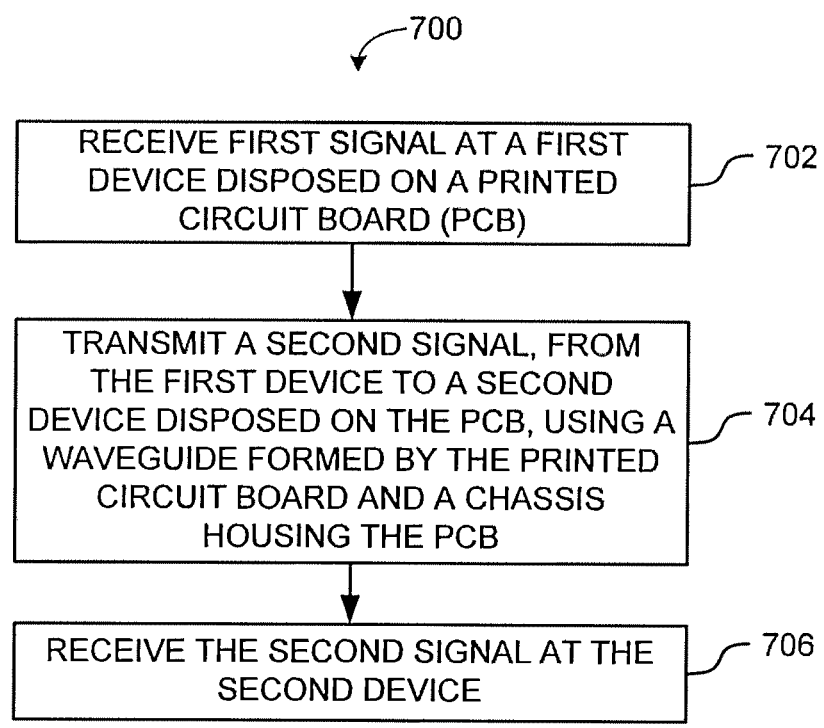
FIG. 7 is a flowchart illustrating an exemplary method for using waveguides formed in accordance with some embodiments.

FIG. 7 is a flowchart 700 illustrating an exemplary method for using waveguides formed in accordance with some embodiments. The method illustrated in FIG. 7 may be utilized with high frequency components of a satellite receiver in accordance with some embodiments. As shown, the method begins at operation 702, where a first signal is received at a first device disposed on a printed circuit board (PCB) (e.g., on a device layer of the PCB). In some embodiments, the first device may receive the first signal from an antenna feed (e.g., a Ka Band satellite feed for a Ka Band signals at 102.8°, a Ku Band satellite feed for a Ku band signal at 101°, and a Ka Band satellite feed for a Ka Band signals at 99.2°).

At operation 704, the first device transmits a second signal, based on the first signal, to a second device on the PCB (e.g., on the device layer of the PCB). In doing so, the first device uses a waveguide formed by the PCB and a chassis housing the PCB. In accordance with some embodiments, the waveguide may be formed by a ground plane of the PCB (e.g., opposite the device layer) and a groove in the chassis. At operation 706, the second device receives the second signal from the first device via the waveguide.

Depending on the embodiment, the first device may be a pre-amplifier and the second device may be an amplifier, or the first device may be an oscillator and the second device may be an amplifier. Additionally, in some embodiments, the waveguide, used to communicate the second signal from the first device to the second device, may be configured to function as a band pass filter that filters predetermined frequencies from the second signal before the second signal is received by the second device.

Figure 8:
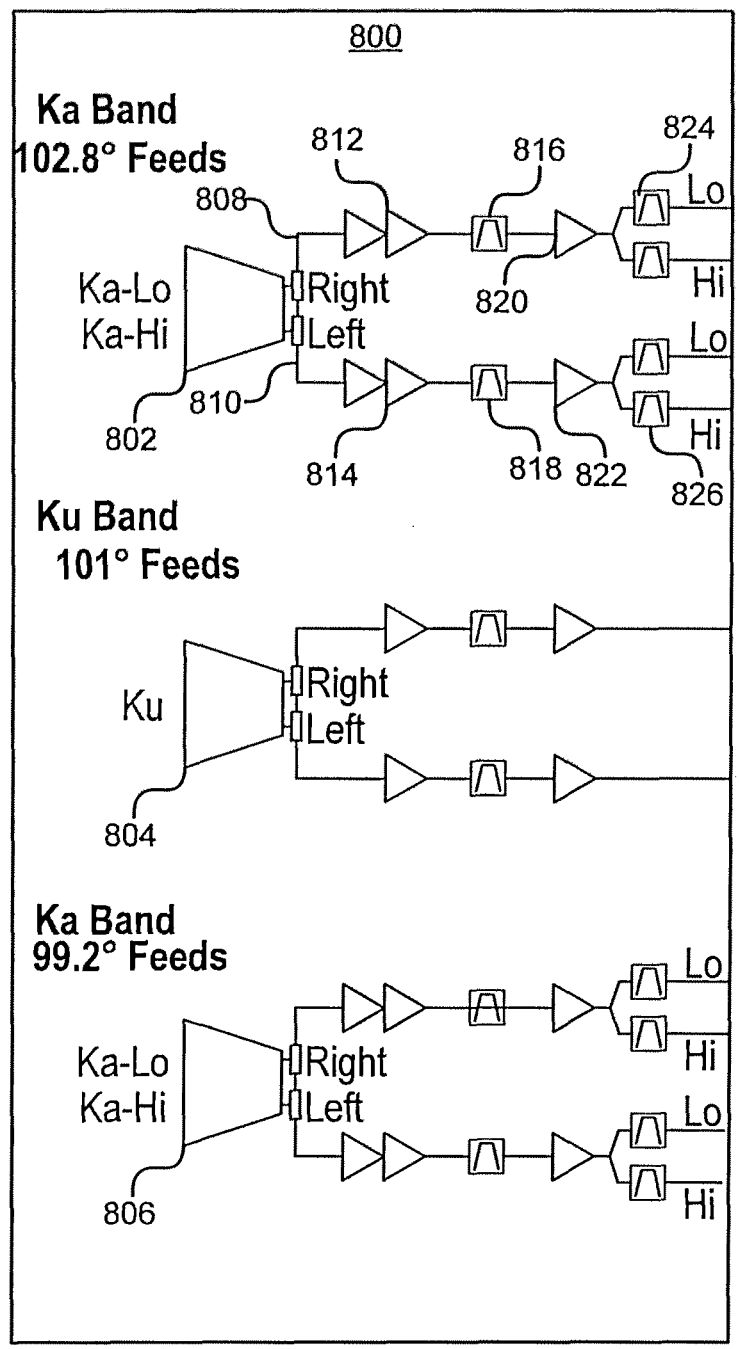
FIG. 8 is a diagram illustrating an exemplary implementation of high frequency components of a satellite receiver using waveguides formed in accordance with some embodiments.

FIG. 8 is a diagram illustrating an exemplary implementation of high frequency components of a satellite receiver using waveguides formed in accordance with some embodiments. The high frequency components, which are depicted in a chassis 800, may be part of a low-noise downconverter (LNB) that utilizes waveguides formed in accordance with some embodiments.

In some embodiments, the illustrated components may be implemented on one or more printed circuit boards (PCBs) housed in the chassis 800 (e.g., in a cavity of an LNB chassis). The satellite receiver may include a receiver chain for a Ka Band satellite feed 802 for a Ka Band signals at 102.8°, a Ku Band satellite feed 804 for a Ku band signal at 101°, and a Ka Band satellite feed 806 for a Ka Band signals at 99.2°. As described herein, each band may comprise two channels—one right-hand circularly polarized channel (RHCP) and one left-hand circularly polarized channel (LHCP). For each channel, the satellite receiver may include circuitry for pre-amplification, band pass filtering, and further amplification. In some embodiments, various signal distribution or filtering operations may be implemented by waveguides formed in the chassis 800 using grooves in the chassis 200 and the ground plane of a PCB housed in the chassis 800.

For example, with reference to the Ka Band feed 802 for Ka Band signals at 102.8°, one or more of the signal distribution lines 808 and 810 from the feed 802 to amplifiers 812 and 814 may be implemented as waveguides formed in accordance with embodiments described herein. Additionally, the signal distribution lines between amplifiers 812 and 814, filters 816 and 818, and amplifiers 820 and 822 may be implemented as waveguides formed in accordance with embodiments described herein. Additionally, one or more of the filters 816 and 818 may be implemented in waveguides formed in accordance with embodiments described herein. Accordingly, in some embodiments, a single waveguide may transmit signals from amplifier 812 to amplifier 820 and implement the band pass filter 816. Additionally, waveguides may be used for signal distribution from the amplifiers 820 and 822. In some embodiments, waveguides may be used to implement band pass filters 824 and 826 on the high and low channels of the Ka Band RHCP and LHCP channels.

In various embodiments, some or all of these high frequency signal distribution functions and filtering functions may be implemented as waveguides. Additionally, some of the filtering and signal distributions on the LNB may be implemented using traces and conventional filters on PCB. Accordingly, use of the chassis for waveguides provides circuit designers and additional degree of freedom for design of signal distribution.

While various embodiments have been described above, it should be understood that they have been presented by way of example only, and not of limitation. Various embodiments of the invention(s) are not restricted to the illustrated example architectures or configurations. As will be apparent to one of skill in the art, many features can be implemented using a variety of alternative architectures or configurations. With regard to flow diagrams, operational descriptions and method claims, the order in which the steps are presented are not mandatory unless the context dictates otherwise.

The breadth and scope of the disclosure is not limited by any of the above-described exemplary embodiments. The various features, aspects and functionality described in one or more of the individual embodiments are not limited in their applicability to the particular embodiment with which they are described, but instead can be applied, alone or in various combinations, to one or more of the other embodiments, whether or not such embodiments are described and whether or not such features are presented as being a part of a described embodiment.

Terms and phrases used in this document, and variations thereof, unless otherwise expressly stated, should be construed as open ended as opposed to limiting. As examples of the foregoing: the term "including" should be read as meaning "including, without limitation"; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future. The presence of broadening words and phrases such as "one or more," "at least," "but not limited to" or other like phrases in some instances shall not be read to mean that the narrower case is intended or required in instances where such broadening phrases may be absent.

The invention claimed is:
1. An apparatus, comprising:
a chassis;
a printed circuit board comprising a ground plane and a device layer;
a first device disposed on the device layer;
a second device disposed on the device layer;

a waveguide coupling the first device and the second device, the waveguide having at least one side formed by a groove in the chassis and at least one side formed by the ground plane of the printed circuit board; and a printed filter disposed on the device layer and coupled between the waveguide and the first device or between the waveguide and the second device such that the printed filter and the waveguide implement a composite filter.

2. The apparatus of claim 1, wherein the groove forms at least three sides of the waveguide and the ground plane of the printed circuit board forms a fourth side.

3. The apparatus of claim 1, wherein the waveguide is configured to implement a band pass filter, a low pass filter, a high pass filter, or a band stop filter.

4. The apparatus of claim 1, wherein the waveguide is configured to perform signal distribution.

5. The apparatus of claim 1, wherein the chassis comprises a cavity housing the printed circuit board.

6. The apparatus of claim 1, wherein the printed circuit board is configured to implement a low noise block downconverter (LNB).

7. The apparatus of claim 1, wherein the ground plane of the printed circuit board is in direct contact with the chassis.

8. The apparatus of claim 1, wherein the printed circuit board is disposed over the groove of the chassis such that the ground plane of the printed circuit board is capacitively coupled with the chassis.

9. The apparatus of claim 1, wherein the printed circuit board is disposed over the groove of the chassis such that the ground plane of the printed circuit board is capacitively coupled with the chassis.

10. The apparatus of claim 1, wherein the first device is an amplifier, an antenna feed, or a mixer.

11. A method, comprising:

receiving a first signal at a first device disposed on a device layer of a printed circuit board, wherein the printed circuit board comprises a ground plane and the device layer;

transmitting a second signal, from the first device to a second device disposed on the device layer of the printed circuit board, using a waveguide having at least one side formed by a groove in a chassis housing the printed circuit board and at least one side formed by the ground plane of the printed circuit board, wherein the second signal is based on the first signal;

receiving the second signal at the second device disposed on the device layer of the printed circuit board; and wherein a printed filter disposed on the device layer is coupled between the waveguide and the first device or between the waveguide and the second device such that the printed filter and the waveguide implement a composite filter.

12. The method of claim 11, wherein the groove forms at least three sides of the waveguide and the ground plane of the printed circuit board forms a fourth side.

13. The method of claim 11, wherein the waveguide is configured to implement a band pass filter, a low pass filter, a high pass filter, or a band stop filter.

14. The method of claim 11, wherein the waveguide is configured to perform signal distribution.

15. The method of claim 11, wherein the chassis comprises a cavity housing the printed circuit board.

16. The method of claim 11, wherein the printed circuit board is configured to implement a low noise block downconverter (LNB).

17. The method of claim 11, herein the ground plane of the printed circuit board is in direct contact with the chassis.

18. The method of claim 11, wherein the printed circuit board is disposed over the groove of the chassis such that the ground plane of the printed circuit board is capacitively coupled with the chassis.

19. The method of claim 11, wherein the first device is an amplifier, an antenna feed, or a mixer.

* * * * *